United States Patent
Moon

(10) Patent No.: US 9,000,424 B2
(45) Date of Patent: Apr. 7, 2015

(54) ORGANIC LIGHT EMITTING DIODE DISPLAY AND METHOD FOR MANUFACTURING AN ORGANIC LIGHT EMITTING DIODE DISPLAY

(71) Applicant: Samsung Display Co., Ltd., Yongin, Gyeonggi-do (KR)

(72) Inventor: Sung-Hoon Moon, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/908,216

(22) Filed: Jun. 3, 2013

(65) Prior Publication Data

US 2013/0334508 A1   Dec. 19, 2013

(30) Foreign Application Priority Data

Jun. 15, 2012   (KR) .................. 10-2012-0064404

(51) Int. Cl.
*H01L 29/08* (2006.01)
*H01L 51/52* (2006.01)
*H01L 51/56* (2006.01)

(52) U.S. Cl.
CPC ............ *H01L 51/5203* (2013.01); *H01L 51/56* (2013.01)

(58) Field of Classification Search
USPC ......................... 257/40, 98, 59, 72
See application file for complete search history.

(56) References Cited

U.S. PATENT DOCUMENTS

| 2006/0202205 A1* | 9/2006 | Lee et al. ............ 257/59 |
| 2009/0146927 A1* | 6/2009 | Wan et al. ........... 345/76 |
| 2011/0049523 A1* | 3/2011 | Choi et al. .......... 257/72 |
| 2012/0001191 A1* | 1/2012 | Ma et al. ............. 257/71 |

FOREIGN PATENT DOCUMENTS

KR    10-0913794 B1    8/2009
KR    10-2011-0036456 A    4/2011

* cited by examiner

*Primary Examiner* — Tan N Tran
(74) *Attorney, Agent, or Firm* — Knobbe Martens Olson & Bear LLP

(57) ABSTRACT

An OLED display is disclosed which included gate wires provided on a substrate and extended in a first direction, data wires provided on the gate wires and extended in a second direction that crosses the first direction; a pixel circuit including first thin film transistors respectively connected to the gate wires and the data wires; and an organic light emitting diode connected to the pixel circuit. The thin film transistor includes a first active layer provided on the substrate to connect the data wires and the organic light emitting diode, and includes a channel area, a source area, and a drain area. The source area and the drain area doped with an impurity and a first gate electrode is not doped with the impurity and provided on the first active layer, interposing sequentially layered first and second insulation layers therebetween.

5 Claims, 9 Drawing Sheets

ORGANIC LIGHT EMITTING DIODE DISPLAY AND METHOD FOR MANUFACTURING AN ORGANIC LIGHT EMITTING DIODE DISPLAY

CROSS-REFERENCE TO RELATED APPLICATIONS

This application claims priority to and the benefit of Korean Patent Application No. 10-2012-0064404 filed in the Korean Intellectual Property Office on Jun. 15, 2012, the entire contents of which are incorporated herein by reference.

BACKGROUND

1. Field

The described technology relates generally to an organic light emitting diode (OLED) display and a manufacturing method thereof. More particularly, the described technology relates generally to an OLED display including a pixel circuit including a plurality of thin film transistors and one or more capacitors, and a manufacturing method thereof.

2. Description of the Related Technology

Unlike a liquid crystal display (LCD), the OLED display has a self-light emitting characteristic so that a separate light source is not required. Therefore, the dimensions and weight thereof may be reduced. Further, because the OLED display has high quality characteristics such as low power consumption, high luminance, and high reaction speed, the OLED display is appropriate for use in a mobile electronic device.

In general, the OLED display includes gate wires provided on a substrate and extended in one direction, data wires extended in a direction crossing the gate wires, a pixel circuit connected with the gate wires and the data wires and including a switching thin film transistor, a driving thin film transistor, a driving thin film transistor, and one or more capacitors, and an organic light emitting diode connected with the pixel circuit.

Recently, a thicker insulation layer is formed between an active layer and a gate electrode of the driving thin film transistor compared to the switching thin film transistor in order to increase the driving range of a gate voltage applied to the gate electrode of the driving thin film transistor.

However, when an impurity is doped to a source area and a drain area of the active layer of each of the driving thin film transistor and the switching thin film transistor using the gate electrode as a mask, the impurity may not be easily doped to the active layer of the driving thin film transistor because the thicker insulation layer compared to the switching thin film transistor is formed between the active layer and the gate electrode of the driving thin film transistor.

Accordingly, the thickness of the insulation layer formed between the active layer and the gate electrode of the driving thin film transistor cannot exceed a predetermined thickness for impurity doping with respect to the active layer of the driving thin film transistor.

SUMMARY OF CERTAIN INVENTIVE ASPECTS

An exemplary embodiment provides an OLED display of which a source area and a drain area of an active layer of each of a plurality of thin film transistors are simply doped with an impurity although a thicker insulation layer is provided between a gate electrode and an active layer of at least one of the plurality of thin film transistors, and a method for manufacturing the OLED display.

Some embodiments disclosed herein provide an OLED display including: gate wires provided on a substrate and extended in a first direction; data wires provided on the gate wires and extended in a second direction that crosses the first direction; a pixel circuit having at least a first thin film transistors respectively connected to the gate wires and the data wires; and an organic light emitting diode connected to the pixel circuit, and the thin film transistor includes a first active layer provided on the substrate, the first active layer including a channel area, a source area, and a drain area, the source area and the drain area doped with an impurity configured to connect the data wires and the organic light emitting diode, and a first gate electrode which is not doped with the impurity and provided on the first active layer, with sequentially layered first and second insulation layers disposed between the first gate electrode and the first active layer.

The pixel circuit further includes a first capacitor connected with the data wires, and the first capacitor may include a first capacitor electrode formed in the same layer where the first gate electrode is formed and connected with the first gate electrode and a second capacitor electrode provided on the first capacitor electrode, a third insulation layer disposed therebetween, and wherein the second capacitor electrode is in electrical contact with the data wires.

The pixel circuit further includes a second capacitor connected with the gate wires, and the second capacitor may include a third capacitor electrode formed in the same layer where the first gate electrode is formed, the third capacitor electrode electrically connected to the first capacitor electrode and a fourth capacitor electrode provided on the third capacitor electrode, having the third insulation layer disposed therebetween, and wherein the fourth capacitor electrode is electrically connected with the gate wires.

The pixel circuit further include a second thin film transistor connected with the first thin film transistor, and the second thin film transistor may include a second active layer provided on the substrate configured to establish a connection between the data wires and the first thin film transistor, and including a channel area, a source area, and a drain area, the source area and the drain area are doped with the impurity and a second gate electrode provided on the second active layer, interposing the first insulation layer therebetween and connected with the gate wires, and doped with the impurity.

The first active layer may be formed by doping the impurity to the source area and the drain area using a gate pattern formed in the same layer where the gate electrode is formed as a mask, and the first gate electrode may be formed after the gate electrode is eliminated.

The first active layer may be formed by doping the impurity to the source area and the drain area using a photoresist pattern formed in the same layer where the second electrode is formed as a mask, and the first gate electrode may be formed after the photoresist pattern is eliminated.

The pixel circuit further include a second thin film transistor connected with the first thin film transistor, and the second thin film transistor may include a second active layer provided on the substrate configured to establish a connection between the data wires and the first thin film transistor, and including a channel area, a source area, and a drain area, the source area and the drain area are doped with the impurity and a second gate electrode provided on the second active layer, interposing the first insulation layer and the second insulation layer therebetween and connected with the gate wires, and not doped with the impurity.

Some embodiments disclosed herein provide an OLED display including: gate wires provided on a substrate and extended in a first direction; data wires provided on the gate wires and extended in a second direction that crosses the first direction; a pixel circuit including a plurality of thin film transistors respectively connected to the gate wires and the data wires; and an organic light emitting diode connected to the pixel circuit, and at least one of the plurality of thin film transistors may include a gate electrode that is not doped with an impurity, and other thin film transistors comprise gate electrodes doped with the impurity.

Some embodiments disclosed herein provide a method for manufacturing an OLED display, and the method includes: forming a first active layer including a channel area, a source area, and a drain area on a substrate, the source area and the drain area neighboring each other, interposing the channel area therebetween; forming a first insulation layer on the first active layer and forming a gate pattern on the first insulation layer that corresponds to the channel area; doping an impurity to the source area and the drain area of the first active layer using the gate pattern as a mask; removing the gate pattern; and forming a second insulation layer on the first insulation layer, and forming a first gate electrode on the second insulation layer that corresponds to the channel area.

The method may further include forming a second active layer simultaneously with the first active layer.

The method may further include forming a second gate electrode on the second active layer simultaneously with the gate pattern.

The method may further include doping an impurity to a source area and a drain area of the second active layer using the second gate electrode as a mask.

The doping the impurity to the source area and the drain area of the second active layer may be simultaneously performed with doping the impurity to the source area and the drain area of the first active layer using the gate pattern as a mask.

Some embodiments disclosed herein provide a method for manufacturing an OLED display. The method includes: forming a first active layer including a channel area, a source area, and a drain area on a substrate, the source area and the drain area neighboring each other, interposing the channel area therebetween; forming a first insulation layer on the first active layer and forming a photoresist pattern on the first insulation layer that corresponds to the channel area; doping an impurity to the source area and the drain area of the first active layer using the photoresist pattern as a mask; eliminating the photoresist pattern; and forming a second insulation layer on the first insulation layer, and forming a first gate electrode on the second insulation layer that corresponds to the channel area.

The method may further include forming a second active layer simultaneously with the first active layer.

The method may further include forming a second gate electrode on the second active layer.

The forming the photoresist pattern may be performed in an order different from the order of forming of the second gate electrode.

The method may further include doping an impurity to a source area and a drain area of the second active layer using the second gate electrode as a mask.

The doping the impurity to the source area and the drain area of the second active layer may be performed simultaneously with the doping the impurity to the source area and the drain area of the first active layer using the photoresist pattern as a mask.

According to one exemplary embodiment of the present invention, an OLED display of which a source area and a drain area of an active layer of each of a plurality of thin film transistors can be simply doped with an impurity although a thick insulation layer is provided between a gate electrode and an active layer of at least one of the plurality of thin film transistors, and a method for manufacturing the OLED display can be provided.

Further, an OLED display of which the thickness of an insulation layer formed between an active layer and a gate electrode of at least one of a plurality of thin film transistors can be increased more than a predetermined thickness, and a method for manufacturing the OLED display can be provided.

DETAILED DESCRIPTION OF CERTAIN INVENTIVE EMBODIMENTS

Figure 1:
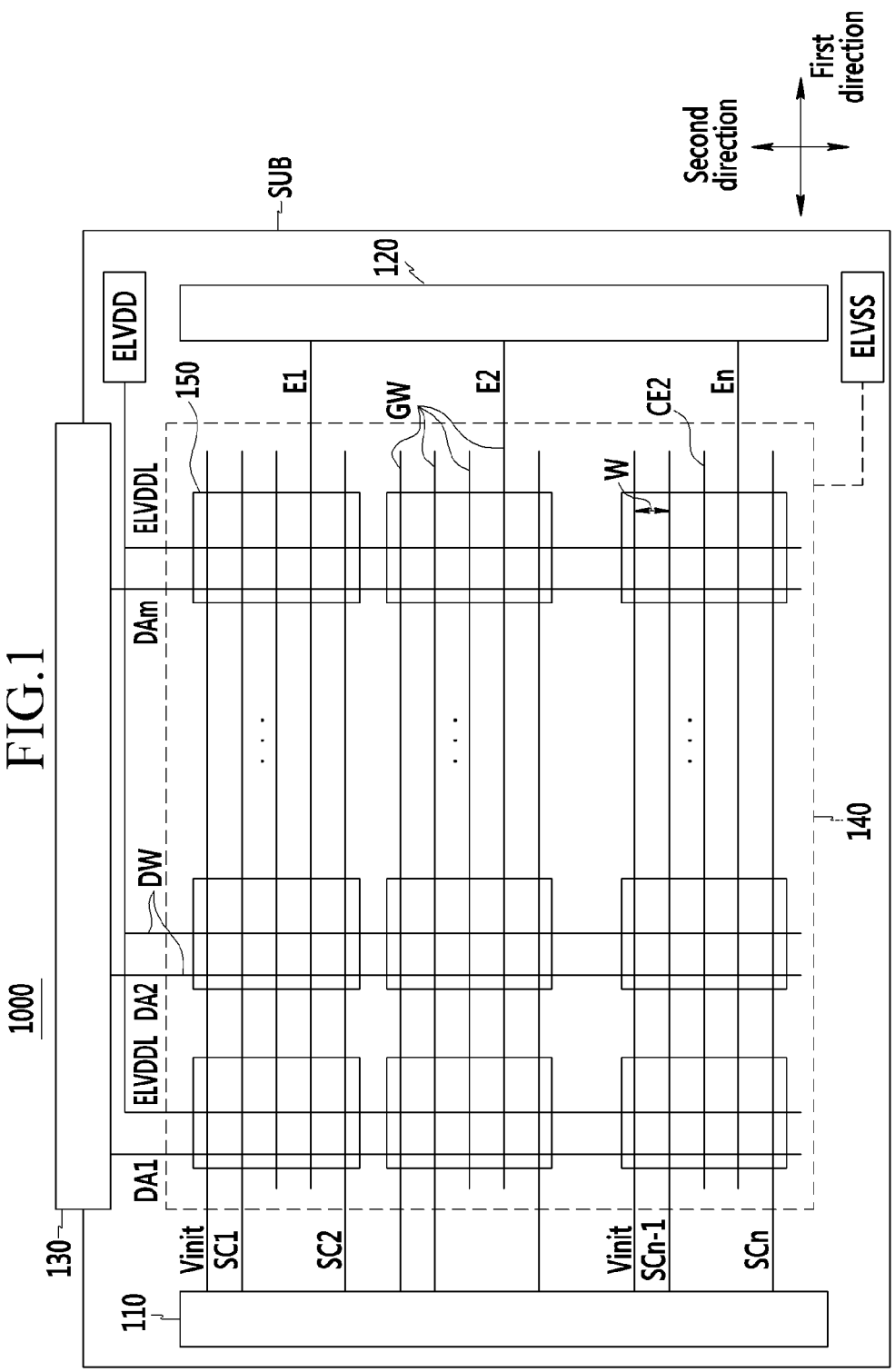
FIG. 1 schematically shows an organic light emitting diode (OLED) display according to a first exemplary embodiment.

Embodiments disclosed herein will be described more fully hereinafter with reference to the accompanying drawings, in which exemplary embodiments. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

The size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. It will be understood that when an element such as a layer, film, region, or plate is referred to as being "on" another element, it can be directly on the other element or intervening elements may also be present.

In addition, the accompanying drawing illustrates an active matrix (AM) type organic light emitting diode (OLED) display having a 6Tr-2Cap structure in which each pixel is provided 6 thin film transistors (TFT) and two capacitors, but the present invention is not limited thereto. Thus, the OLED display may have various structures. For example, each pixel of the OLED display may be provide with a plurality of thin film transistors and one or more capacitors, and additional wires may be further formed or an existing wire may be omitted. Here, the pixel refers to a minimum unit for displaying an image, and the OLED display displays an image through the plurality of pixels.

Hereinafter, an organic light emitting diode (OLED) display according to a first exemplary embodiment will be described with reference to FIGS. 1 to 8.

FIG. 1 schematically shows an OLED display according to the first exemplary embodiment.

As shown in FIG. 1, an OLED display 1000 according to the first exemplary embodiment includes a gate driver 110, gate wires GW, a light emission control driver 120, a data driver 130, data wires DW, a display unit 140, and a pixel 150.

The gate driver 110 sequentially supplies scan signals to first scan lines SC2 to SCn or second scan lines SC1 to SCn−1 included in the gate wires GW corresponding to an external control circuit (not shown), for example, a control signal supplied from a timing controller. Then, pixels 150 are selected by the scan signal and sequentially receive data signals.

The gate wires GW are disposed on a substrate SUB and extended in a first direction. The gate wires GW include a first scan line SCn, a second scan line SCn−1, an initialization power line Vinit, and light emission control lines E1 to En. The first scan line SCn is connected with the gate driver 110 and receives a scan signal from the gate driver 110. The second scan line SCn−1 is connected with the gate driver 110 and receives a scan signal from the gate driver 110. The initialization power line Vinit is connected with the gate driver 110 an receives initialization power from the gate driver 110. The light emission control line En is connected with the light emission control driver 120, and receives a light emission control signal from the light emission control driver 120.

In the first exemplary embodiment, the initialization power line Vinit receives the initialization power from the gate driver 110, but in another exemplary embodiment, the initialization power line Vinit may be connected with another additional constituent element and receive initialization power from the other additional constituent element.

The gate wires GW may be respectively provided in the same layer or may respectively provided in different layers. In addition, the gate wires GW may respectively overlap each other or may not overlap each other.

The light emission control driver 120 sequentially supplies light emission control signals to the light emission control line En corresponding to a control signal supplied from an external source such as a timing controller. Then, light emission of the pixel 150 is controlled by the light emission control signal.

That is, the light emission control signal controls light emission time of the pixel 150. However, the light emission control driver 120 may be omitted according to an internal structure of the pixel 150.

The data driver 130 supplies a data signal to a data line DAm among the data wires DM corresponding to the control signal supplied from an external source such as a timing controller. The data signal supplied to the data line DAm is supplied to a pixel 150 selected by a scan signal when the scan signal is supplied to the first scan line SCn. Then, the pixel 150 changes a voltage corresponding to the data signal and emits light with luminance corresponding thereto.

The data wires DW are disposed on the gate wires GW, and extended in a second direction crossing the first direction. The data wires DW include data lines DA1 to DAm and a driving power line ELVDDL. The data line DAm is connected with the data driver 130, and receive a data signal from the data driver 130. The driving power line ELVDDL is connected with external first power source ELVDD, and receives driving power from the first power source ELVDD.

A display unit 140 includes a plurality of pixels 150 provided in crossing areas of the gate wires GW and the data wires DW. Here, each pixel 150 includes an organic light emitting element which emit light with luminance that corresponds to a driving current which, in turn, corresponds to a data signal and a pixel circuit for controlling the driving current flowing to the organic light emitting element. The pixel circuit is connected to each of the gate wires GW and each of the data wires DW, and the organic light emitting element is connected to the pixel circuit.

The organic light emitting element of the display unit 140 is connected with the external first power source ELVDD, interposing the pixel circuit therebetween, and connected with second power source ELVSS. Each of the first power source ELVDD and the second power source ELVSS supplies driving power and common power to the display unit 140 and the pixels 150, and the pixel 150 emits light with luminance corresponding to a driving current flowing through the organic light emitting element from the first power source ELVDD corresponding the data signal according to the driving power and the common power supplied thereto.

Hereinafter, the pixel 150 of the OLED display 1000 according to the first exemplary embodiment will be described with reference to FIG. 2 and FIG. 3.

Figure 2:
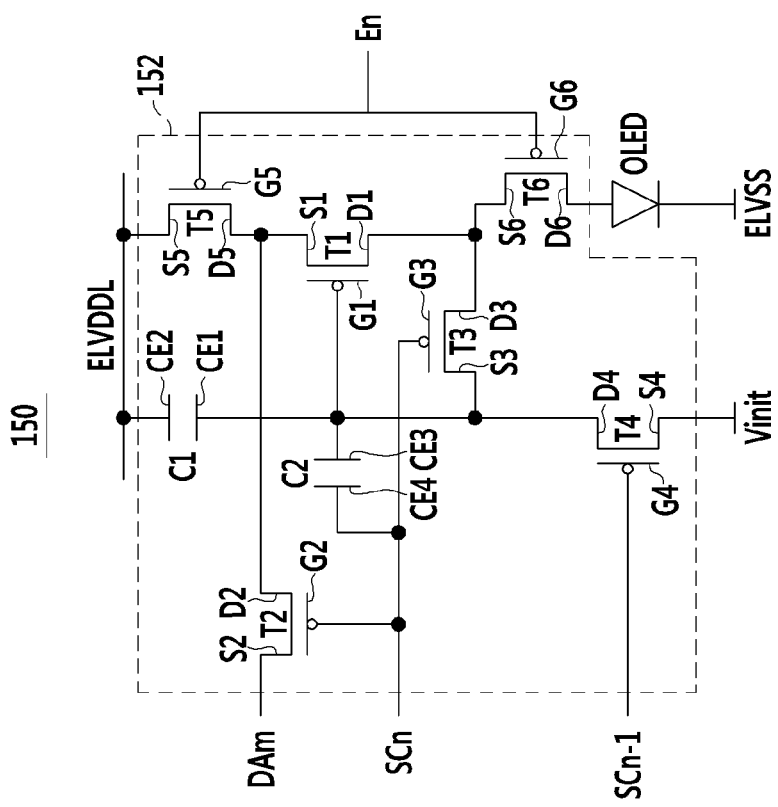
FIG. 2 is a circuit diagram of a pixel shown in FIG. 1.

FIG. 2 is a circuit diagram of the pixel shown in FIG. 1. FIG. 3 is a cross-sectional view of the pixel circuit and the organic light emitting diode of FIG. 2.

Figure 3:
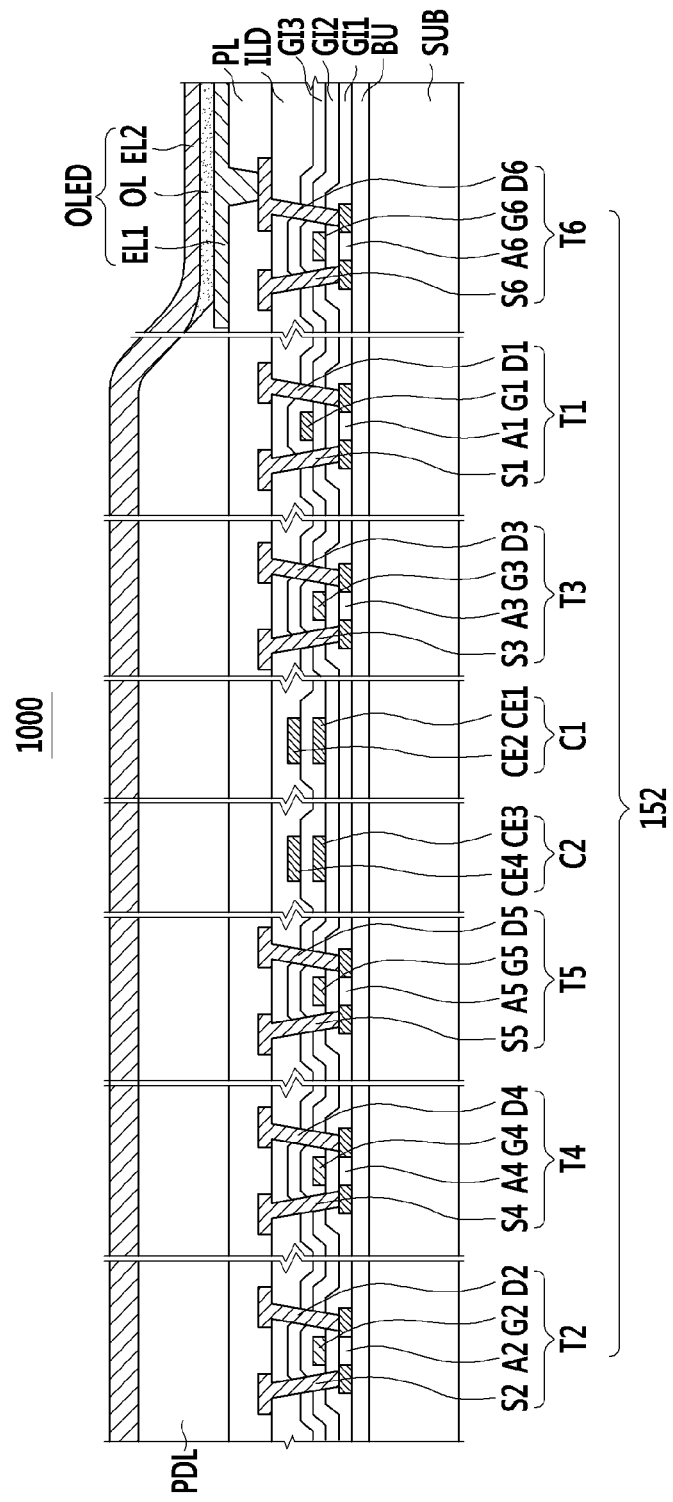
FIG. 3 is a cross-sectional view of a pixel circuit and an organic light emitting element of FIG. 2.

As shown in FIG. 2 and FIG. 3, the pixel 150 includes an organic light emitting diode OLED connected between the first power source ELVDD and the second power source ELVSS and a pixel circuit 152 connected between the first power source ELVDD and the organic light emitting diode OLED to control driving power supplied to the organic light emitting diode OLED.

An anode of the organic light emitting diode OLED is connected to the driving power line ELVDDL connected to the first power source ELVDD via the pixel circuit 152, and a cathode of the organic light emitting diode OLED is connected to the second power source ELVSS. The organic light emitting diode OLED emits light with luminance that corresponds to a driving current flowing to the organic light emitting diode OLED when driving power is supplied thereto from the first power source ELVDD through the pixel circuit 152 and common power is supplied thereto from the second power source ELVSS.

The pixel circuit 152 includes a first thin film transistor T1, a second thin film transistor T2, a third thin film transistor T3, a fourth thin film transistor T4, a fifth thin film transistor T5, a sixth thin film transistor T6, a first capacitor C1, and a second capacitor C2.

The first thin film transistor T1 is connected between the driving power line ELVDDL and the organic light emitting diode OLED, and supplies driving power that corresponds to a data signal to the organic light emitting diode OLED from the first power source ELVDD during a light emission period of the pixel 150. That is, the first thin film transistor T1 functions as a driving transistor of the pixel 150. The first thin film transistor T1 includes a first active layer A1, a first gate electrode G1, a first source electrode S1, and a first drain electrode D1.

The first active layer A1 includes polysilicon, and includes source and drain areas that are doped with an impurity and a channel area provided between the source area and the drain area. The first active layer A1 is provided between a buffer layer BU formed on the substrate SUB and a first insulation layer GI1. When the first gate electrode G1 turns on, the first active layer A1 establishes a connection between the driving power line ELVDDL among the data wires DW and the organic light emitting diode OLED.

The first gate electrode G1 is connected with a first capacitor electrode CE1 of the first capacitor C1, and provided in the same layer of the first capacitor electrode CE1. The first gate electrode G1 is provided on the channel area of the first active layer A1, interposing the first insulation layer GI1 and the second insulation layer GI2 that are sequentially layered on the first active layer A1. That is, the first insulation layer GI1 and the second insulation layer GI2 are provided between the first gate electrode G1 and the first active layer A1. The first gate electrode G1 is not doped with an impurity. The reason that the first gate electrode G1 is not doped with an impurity will be described later herein.

The first source electrode S1 is connected with the driving power line ELVDDL via the fifth thin film transistor T5.

The first drain electrode D1 is connected with the organic light emitting diode OLED via the sixth thin film transistor T6.

The second thin film transistor T2 is connected between the data line DAm and the first thin film transistor T1, and transmits a data signal supplied from the data line DAm to the pixel 150 when the scan signal is supplied from the first scan line SCn. That is, the second thin film transistor T2 functions as a switching transistor of the pixel 150. The second thin film transistor T2 includes a second active layer A2, the second gate electrode G2, the second source electrode S2 and the second drain electrode D2.

The second active layer A2 includes polysilicon, and includes source and drain areas that are doped, with an impurity and a channel area provided between the source area and the drain area. The second active layer A2 is provided between the buffer layer BU formed on the substrate SUB and the first insulation layer GI1. When the second gate electrode G2 is turned on, the second active layer A2 establishes a connection between the data line DAm among the data wires DW and the first thin film transistor T1.

The second gate electrode G2 is connected with the first scan line SCn, and provided on the channel area of the second active layer A2, interposing the first insulation layer GI1 therebetween. That is, the first insulation layer GI1 is provided between the second gate electrode G2 and the second active layer A2. The second gate electrode G2 is doped with an impurity. The reason that the second gate electrode G2 is doped with an impurity will be described later herein.

The second source electrode S2 is connected with the data line DAm. The second drain electrode D2 is connected with the first source electrode S1 of the first thin film transistor T1.

The third thin film transistor T3 is connected between a first drain electrode D1 of the first thin film transistor T1 and the first gate electrode G1, and compensates a threshold voltage of the first thin film transistor T1 by diode-connecting the first thin film transistor T1 when a data signal is supplied to the pixel 150. That is, the third thin film transistor T3 functions as a compensation transistor of the pixel 150. The third thin film transistor T3 includes a third active layer A3, a third gate electrode G3, a third source electrode S3, and a third drain electrode D3.

The third active layer A3 includes polysilicon, and includes source and drain areas that are doped with an impurity and a channel area provided between the source area and the drain area. The third active layer A3 is provided between the buffer layer BU formed on the substrate SUB and the first insulation layer G11.

The third gate electrode G3 is connected with the first scan line SCn, and provided in the same layer of the second gate electrode G2. That is, the first insulation layer GI1 is provided between the third gate electrode G3 and the third active layer A3. The third gate electrode G3 is doped with an impurity. The reason that the third gate electrode G3 is not doped with an impurity will be described later herein. The third source electrode S3 is connected with a first gate electrode G1 of the first thin film transistor T1. The third drain electrode D3 is connected with the first drain electrode D1 of the first thin film transistor T1.

The fourth thin film transistor T4 is connected between the initialization power line Vinit and the first gate electrode G1 of the first thin film transistor T1, and initializes the first thin film transistor T1 by transmitting initialization power supplied to the initialization power line Vinit when the scan signal is supplied from the second scan line SCn−1 during an initialization period which occurs prior to a data programming period to the pixel 150. This allows efficient supply of the data signal to the pixel 150 during the data programming period, during which the data signal is input to the pixel 150. That is, the fourth thin film transistor T4 functions as a switching transistor of the pixel 150. The fourth thin film transistor T4 includes a fourth active layer A4, a fourth gate electrode G4, a fourth source electrode S4, and a fourth drain electrode D4.

The fourth active layer A4 includes polysilicon, and includes source and drain areas that are doped with an impurity and provides a channel area between the source area and the drain area. The fourth active layer A4 is provided between the buffer layer BU formed on the substrate SUB and the first insulation layer GI1.

The fourth gate electrode G4 is connected with the second scan line SCn−1, and is provided in the same layer as the second gate electrode G2. That is, the first insulation layer GI1 is provided between the fourth gate electrode G4 and the fourth active layer A4. The fourth gate electrode G4 is doped with an impurity. The reason that the fourth gate electrode G4 is doped with an impurity is described herein below.

The fourth source electrode S4 is connected with the initialization power line Vinit. The fourth drain electrode D4 is connected with the first gate electrode G1 of the first thin film transistor T1.

The fifth thin film transistor T5 is connected between the driving power line ELVDDL and the first thin film transistor T1, and disconnects the connection between the first power source ELVDD and the first thin film transistor T1 during a non-light emission period of the pixel 150, and establishes a connection between the first power source ELVDD and the first thin film transistor T1 during a light emission period of the pixel 150. That is, the fifth thin film transistor T5 functions as a switching transistor of the pixel 150. The fifth thin film transistor T5 includes a fifth active layer A5, a fifth gate electrode G5, a fifth source electrode S5, and a fifth drain electrode D5.

The fifth active layer A5 includes polysilicon, and includes source and drain areas that are doped with an impurity and provides a channel area between the source area and the drain area. The fifth active layer A5 is provided between the buffer layer BU formed in the substrate SUB and the first insulation layer GI1.

The fifth gate electrode G5 is connected with the light emission control line En, and provided in the same layer as the second gate electrode G2. That is, the first insulation layer GI1 is provided between the fifth gate electrode G5 and the fifth active layer A5. The fifth gate electrode G5 is doped with an impurity. The reason that the fifth gate electrode G5 is doped with an impurity is described herein below.

The fifth source electrode S5 is connected with the driving power line ELVDDL. The fifth drain electrode D5 is connected with the first source electrode S1 of the first thin film transistor T1.

The sixth thin film transistor T6 is connected between the first thin film transistor T1 and the OLED, and disconnects the connection between the first thin film transistor T1 and the OLED during the non-light emission period of the pixel 150, T6 also establishes the connection between the first thin film transistor T1 and OLED during the light emission period of the pixel 150. That is, the sixth thin film transistor T6 functions as a switching transistor of the pixel 150. The sixth thin film transistor T6 includes a sixth active layer A6, a sixth gate electrode G6, a sixth source electrode S6, and a sixth drain electrode D6.

The sixth active layer A6 includes polysilicon, and includes source and drain areas that are doped with an impurity and provides a channel area between the source area and the drain area. The sixth active layer A6 is provided between the buffer layer BU formed in the substrate SUB and the first insulation layer GI1.

The sixth gate electrode G6 is connected with the light emission control line En, and provided in the same layer as the second gate electrode G2. That is, the first insulation layer GI1 is provided between the sixth gate electrode G6 and the sixth active layer A6. The sixth gate electrode G6 is doped with an impurity. The reason that the sixth gate electrode G6 is doped with an impurity is described herein below.

The sixth source electrode S6 is connected with the first drain electrode D1 of the first thin film transistor T1. The sixth drain electrode D6 is connected with the anode of the organic light emitting diode OLED.

In some embodiments of an OLED display 1000, the first through sixth source electrodes S1-S6 and the first through sixth drain electrodes D1-D6 of each of the first through sixth thin film transistors T1-T6 are respectively formed in layers different from the layers where the first through sixth active layer A1-A6 are formed and thus connected with the active layers A1-A6 to through the first insulation layer GI1, the second insulation layer GI2, the third insulation layer GI3, and the fourth insulation layer ILD. In some embodiments of an OLED display, first to sixth source electrodes and first to sixth thin film transistors of each of first to sixth transistors may be selectively formed in the same layer where first to sixth active layers are formed, respectively. The source electrode and the drain electrode of each of the thin film transistors can be formed of polysilicon selectively doped with an impurity.

The first capacitor C1 stores the data signal supplied to the pixel 150 during the data programming period and maintains the data signal during one frame, and is connected between the driving power line ELVDDL connected with the first power source ELVDD and the first gate electrode G1 of the first thin film transistor T1 connected with the initialization power line Vinit. The first capacitor C1 functions as a storage capacitor. The first capacitor C1 includes a first capacitor electrode CE1 and a second capacitor electrode CE2.

The first capacitor electrode CE1 is connected with the first gate electrode G1 of the first thin film transistor T1 and is provided in the same layer as the first gate electrode G1.

The second capacitor electrode CE2 is connected with the driving power line ELVDDL among the data wires DW, and is provided on the first capacitor electrode CE1, with a third insulation layer GI3 disposed therebetween. The third insulation layer GI3 is provided between the second capacitor electrode CE2 and the first capacitor electrode CE1. As shown in FIG. 1, the second capacitor electrode CE2 may be extended in a first direction, crossing the neighboring pixel 150.

The second capacitor C2 compensates a voltage drop due to a load in the OLED display 1000, and is connected between the first capacitor electrode CE1 of the first capacitor C1 and the first scan line SCn among the gate wires GW. That is, when a voltage level of the present scan signal is changed, the second capacitor C2 functions as a boosting capacitor that increases a voltage of the first gate electrode G1 of the first thin film transistor T1 by coupling at a time point that the supply of the present scan signal is blocked to compensate the voltage drop due to the load in the OLED display 1000. The second capacitor C2 includes a third capacitor electrode CE3 and a fourth capacitor electrode CE4.

The third capacitor electrode CE3 is connected with the first capacitor electrode CE1 of the first capacitor C1, and provided in the same layer of the first gate electrode G1.

The fourth capacitor electrode CE4 is connected with the first scan line SCn among the gate wires GW, and provided on the third capacitor electrode CE3, with the third insulation layer GI3 that is layered on the first gate electrode G1 disposed therebetween. The third insulation layer GI3 is provided between the fourth capacitor electrode CE4 and the third capacitor electrode CE3.

The OLED is connected to the sixth drain electrode D6 of the sixth thin film transistor T6 of the pixel circuit 152.

The organic light emitting diode OLED includes an anode electrode EL1 provided on the sixth drain electrode D6, with a fifth insulation layer PL disposed therebetween. The OLED is connected to the sixth drain electrode D6, and a cathode electrode EL2 is connected to an organic emission layer OL and the second power source ELVSS. The location of the organic emission layer OL may be determined by a pixel definition layer PDL, and the cathode EL2 may be provided throughout the pixel definition layer PDL.

Operation of the pixel 150 may proceed as follows. First, a previous scan signal having a low level is supplied through the second scan line SCn−1 during a first period that is called the initialization period. The fourth thin film transistor T4 is turned on during the initialization period, which corresponding to the previous scan signal, and initialization power from Vinit is supplied to the first thin film transistor T1 through the fourth thin film transistor T4.

Next, a present scan signal having a low level is supplied through the first scan signal SCn during a second period called the data programming period. During this period, the second thin film transistor T2 and the third thin film transistor T3 are turned on with the low-level scan signal SCn.

The first thin film transistor T1 is turned on by being diode-connected by the third thin film transistor T3. Specifically, the first thin film transistor T1 is diode-connected in a forward direction because the first thin film transistor T1 is initialized during the first period.

The data signal supplied from the data line DAm flows via the second thin film transistor T2, the first thin film transistor T1, and the third thin film transistor T3. Accordingly, a voltage corresponding to a difference between the data signal and the threshold voltage of the first thin film transistor T1 is stored in the first capacitor C1.

Next, when the voltage level of the present scan signal is changed to high level while the supply of the present scan signal is blocked, a voltage applied to the first gate electrode G1 of the first thin film transistor T1 is changed corresponding to a voltage change range of the present scan signal due to coupling of the second capacitor C2. In this case, since the voltage applied to the first gate electrode G1 of the first thin film transistor T1 is changed by charge sharing between the first capacitor C1 and the second capacitor C2, the voltage applied to the first gate electrode G1 is changed proportional to the voltage change width of the present scan signal and the charge sharing value between the first capacitor C1 and the second capacitor C2.

Next, a light emission control signal supplied from the light emission control line En is changed from a high level to a low level during a third period that is called the light emission period. During this period, the fifth thin film transistor T5 and the sixth thin film transistor T6 are turned on by the low-level light emission control signal from En. Accordingly, a driving current flows through the driving power line ELVDDL from the first power source ELVDD, via the fifth thin film transistor T5, the first thin film transistor T1, the sixth thin film transistor T6, and the organic light emitting diode OLED.

The driving current is controlled by the first thin film transistor T1, and thus the first thin film transistor T1 generates a driving current that corresponds to the voltage supplied to the first gate electrode G1 of the first thin film transistor T1. In this case, a voltage to which the threshold voltage of the first thin film transistor T1 is reflected is stored in the first capacitor C1 during the data programming period, and therefore the threshold voltage of the first transistor T1 is compensated during the light emission period.

Embodiments of a manufacturing method of the OLED display 1000 are described with reference to FIG. 4 to FIG. 6.

Figure 4:
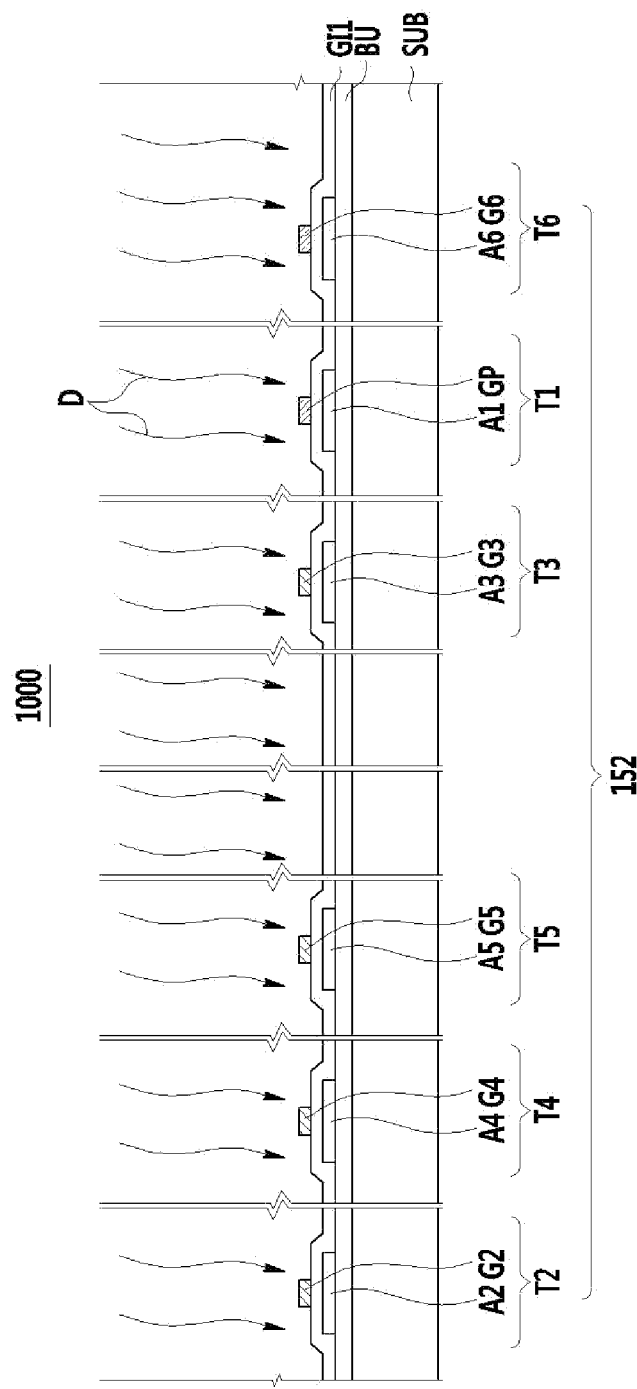
FIG. 4 to FIG. 6 are cross-sectional views depicting a manufacturing method of the OLED display of the first exemplary embodiment.
Figure 5:
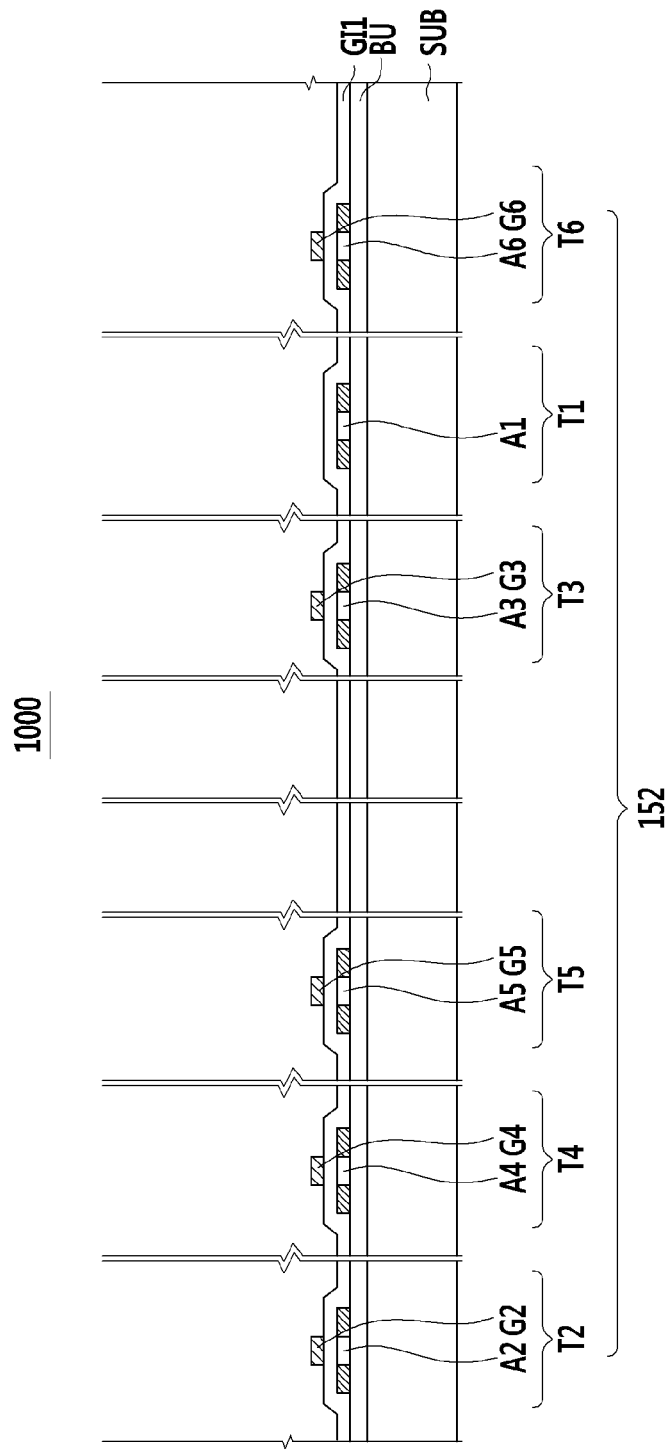
Figure 6:
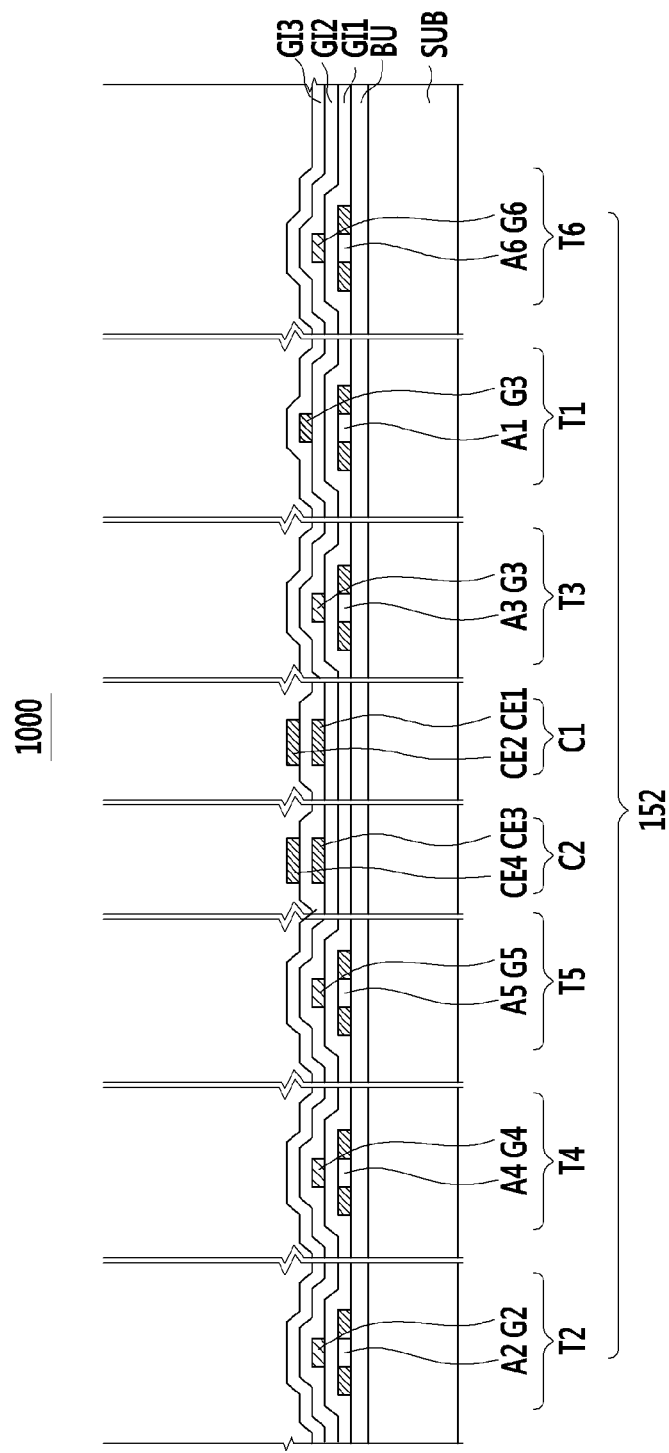

FIG. 4 to FIG. 6 are cross-sectional views for description of a manufacturing method of the OLED display of the first exemplary embodiment.

First, as shown in FIG. 4, the first active layer A1 to the sixth active layer A6 are formed on the substrate SUB. In some embodiments, the buffer layer BU is formed on the substrate SUB, and the first active layer A1 to the sixth active layer A6 are formed by patterning the polysilicon layer on the buffer layer BU using a MEMS process such as photolithography. The polysilicon layer may be formed by crystallizing an amorphous silicon layer using laser, heat, or a metal catalyst. Meanwhile, the first active layer A1 to the sixth active layer A6 may be formed by crystallizing an amorphous silicon pattern that is patterned using laser, heat, or a metal catalyst after patterning the amorphous silicon layer. In this case, each of the first active layer A1 to the sixth active layer A6 may include a channel area, a source area, and a drain area. The source area and the drain area neighbor each other, with the channel area disposed therebetween.

The first insulation layer GI1 is formed on the first active layer A1 to the sixth active layer A6, and a gate pattern and second to sixth gate electrodes G2 to G6 are formed on the first insulation layer GI1. In further detail, the first insulation layer GI1 is formed on the first active layer A1 to the sixth active layer A6 and a gate metal layer is formed on the first insulation layer GI1, and then the gate pattern and the second to sixth gate electrode G2 to G6 are formed by patterning using the MEMS process such as photolithography. Accordingly, the gate pattern is formed in the same layer where the second gate electrode G2 to the sixth gate electrode G6 are formed. The gate pattern and the second gate electrode G2 through the sixth gate electrode G6 may be simultaneously formed.

The source area and the drain area of each of the first active layer A1 to the sixth active layer A6 are doped (D) with an impurity using each of the gate pattern and the second gate electrode G2 to the sixth gate electrode G6 as a mask. In this case, since each of the gate pattern and the second gate electrode G2 to the sixth gate electrode G6 is used as a mask, the gate pattern and the second gate electrode G2 to the sixth gate electrode G6 are doped with the impurity. Meanwhile, the impurity used in the doping may be selected from various known materials. That is, the doping D of the impurity with respect to the source area and the drain area of each of the first active layer A1 to the sixth active layer A6 using each of the gate pattern GP and the second gate electrode G2 to the sixth gate electrode G6 as a mask may be simultaneously performed.

As shown in FIG. 5, the gate pattern, excluding the second gate electrode G2 to the sixth gate electrode G6 are eliminated through dry-etching using a mask.

As shown in FIG. 6, after the gate pattern is eliminated, the second insulation layer GI2 is formed on the second gate electrode G2 to the sixth gate electrode G6 and the first gate electrode G1 is formed on the second insulation layer GI2 corresponding to the channel area of the first active layer A1. In this case, the first capacitor electrode CE1 and the third capacitor electrode CE3 are also formed together with the first gate electrode G1.

The third insulation layer GI3 is formed on the first gate electrode G1, the first capacitor electrode CE1, and the third capacitor electrode CE3, and the second capacitor electrode CE2 and the fourth capacitor electrode CE4 are formed on the third insulation layer GI3.

The fourth insulation layer ILD shown in FIG. 3 is formed, and the first source electrode S1 to the sixth source electrode S6 and the first drain electrode D1 to the sixth drain electrode D6 are formed to make the first thin film transistor T1 to the sixth thin film transistor T6. The OLED is formed together with the fifth insulation layer PL and the pixel definition layer PDL.

The gate wires GW and the data wires DW may be formed together in any one of the first active layer A1 through the sixth active layer A6, the first gate electrode G1 through the sixth gate electrode G6, the first source electrode S1 through the sixth source electrode S6, and the first drain electrode D1 through the sixth drain electrode D6.

Embodiments of manufacturing an embodiment of OLED display 1000 are described with reference to FIG. 7 and FIG. 8.

Figure 7:
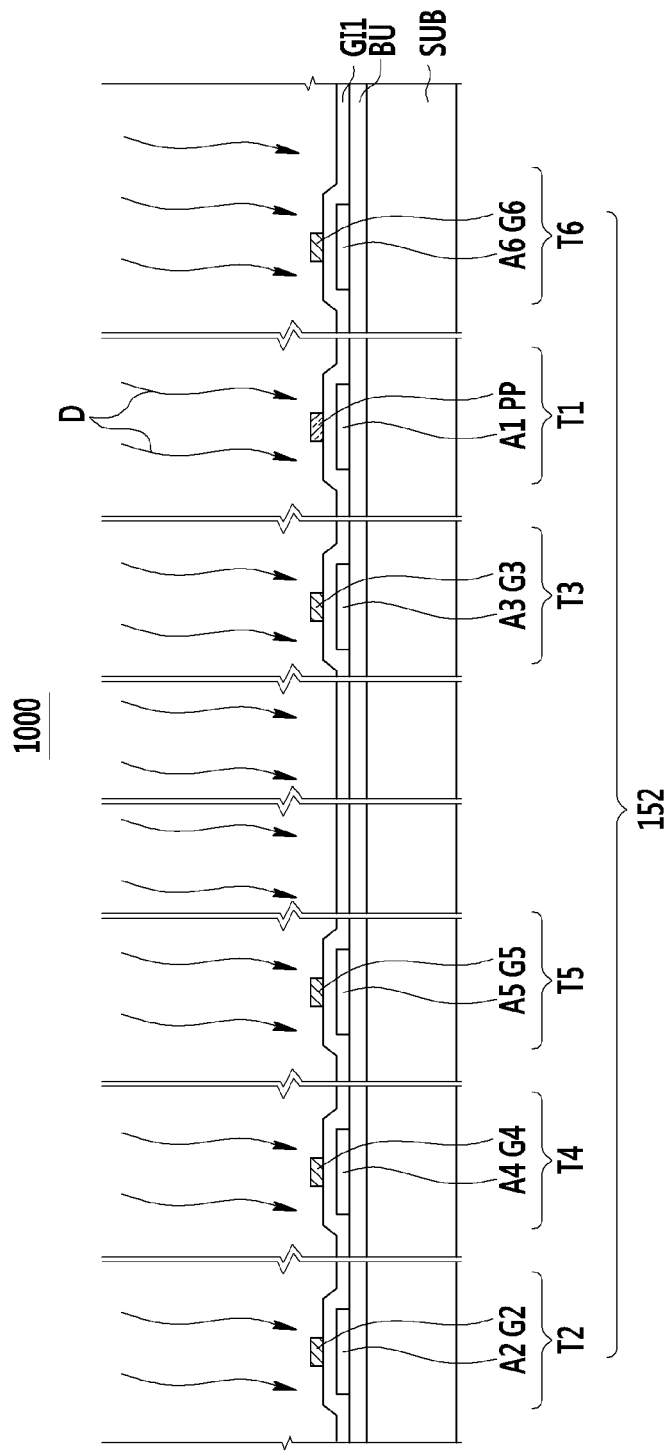
FIG. 7 and FIG. 8 are cross-sectional views depicting an embodiment of a manufacturing method of the OLED display of the first exemplary embodiment.
Figure 8:
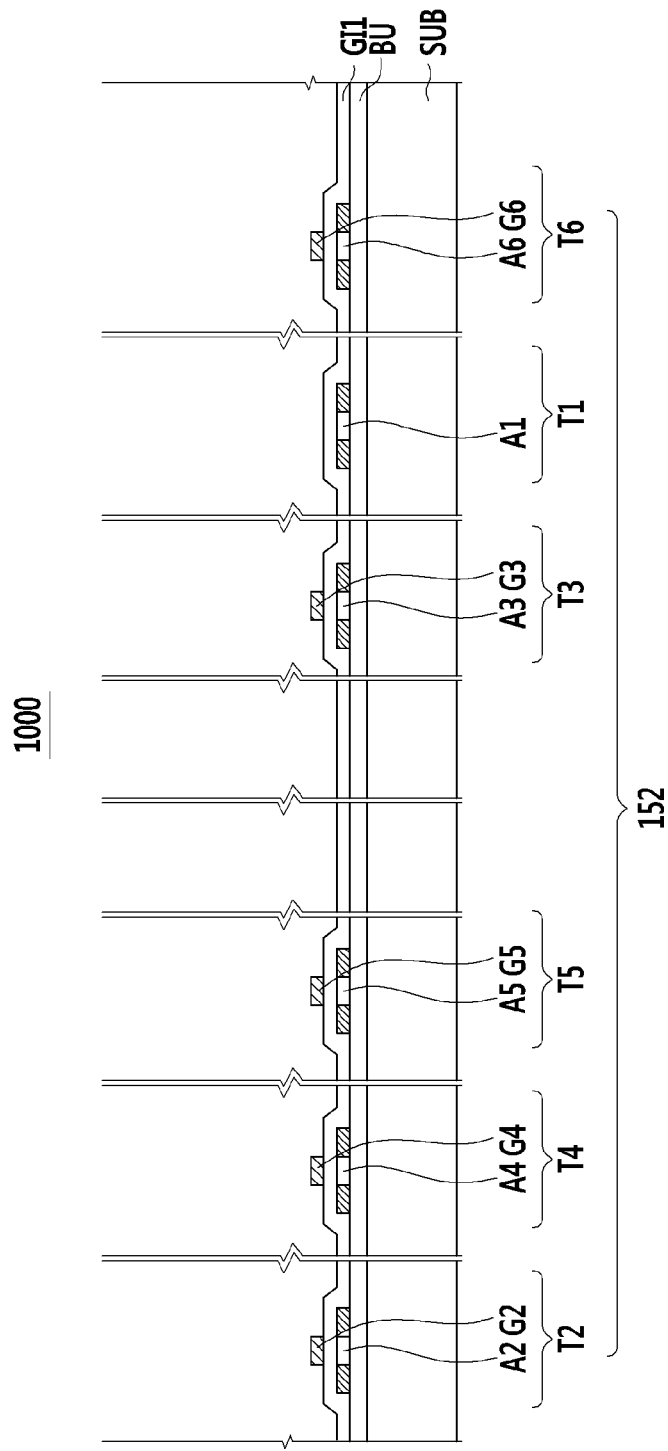

FIG. 7 and FIG. 8 are cross-sectional views of an embodiment of a manufacturing method of an OLED display.

First, as shown in FIG. 7, the first active layer A1 through the sixth active layer A6 are formed on the substrate SUB. In some embodiments, a buffer layer BU is formed on the substrate SUB, and the first active layer A1 through the sixth active layer A6 are formed by patterning the polysilicon layer on the buffer layer BU using a MEMS process such as photolithography. Here, the polysilicon layer may be formed by crystallizing an amorphous silicon layer using laser, heat, or a metal catalyst. The first active layer A1 to the sixth active layer A6 may be formed by crystallizing an amorphous silicon pattern that is patterned using laser, heat, or a metal catalyst after patterning the amorphous silicon layer. In this case, each of the first active layer A1 to the sixth active layer A6 may include a channel area, a source area, and a drain area. The source area and the drain area neighbor each other, with the channel area disposed therebetween.

The first insulation layer GI1 is formed on the first active layer A1 to the sixth active layer A6, and the second to sixth gate electrodes G2 to G6 are formed on the first insulation layer GI1. In further detail, the first insulation layer GI1 is formed on the first active layer A1 to the sixth active layer A6 and a gate metal layer is formed on the first insulation layer GI1, and then the second to sixth gate electrode G2 to G6 are formed by patterning using the MEMS process such as photolithography.

Next, a photoresist pattern is formed on the first insulation layer GI1 that corresponds to the first active layer A1. In further detail, the photoresist layer is formed on the first insulation layer GI1 and the photoresist pattern that corresponds to the first active layer A1 is formed by exposing and developing a photoresist layer using a mask. Accordingly, the photoresist pattern is formed in the same layer where the second gate electrode G2 to the sixth gate electrode G6 are formed. A process for forming the photoresist pattern and a process for forming the second gate electrode G2 to the sixth gate electrode G6 may be performed in a different order, and therefore, the photoresist pattern PP and the second gate electrode G2 to the sixth gate electrode G6 may be formed in a different order.

Next, the source area and the drain area of each of the first active layer A1 to the sixth active layer A6 are doped (D) with an impurity using each the photoresist pattern and the second gate electrode G2 to the sixth gate electrode G6 as a mask. In this case, since each of the photoresist pattern PP and the second gate electrode G2 to the sixth gate electrode G6 is used as a mask, the photoresist pattern PP and the second gate electrode G2 to the sixth gate electrode G6 are doped with the impurity. Meanwhile, the impurity used in the doping may be selected from various known materials. That is, the doping D of the impurity with respect to the source area and the drain area of each of the first active layer A1 to the sixth active layer A6 using each of the photoresist pattern PP and the second gate electrode G2 to the sixth gate electrode G6 as a mask are simultaneously performed.

As shown in FIG. 8, the photoresist pattern PP, excluding the second gate electrode G2 to the sixth gate electrode G6, are eliminated using a lift-off process or an ashing process.

After the photoresist pattern is removed, the second insulation layer GI2 is formed on the second gate electrode G2 to the sixth gate electrode G6, and the first gate electrode G1 is formed on the second insulation layer GI2 that corresponds to the channel area of the first active layer A1. The first capacitor electrode CE1 and the third capacitor electrode CE3 are also formed together with the first gate electrode G1.

The third insulation layer GI3 is formed on the first gate electrode G1, the first capacitor electrode CE1, and the third capacitor electrode CE3, and the second capacitor electrode CE2 and the fourth capacitor electrode CE4 are formed on the third insulation layer GI3.

A fourth insulation layer ILD is formed, and the first source electrode S1 to the sixth source electrode S6 and the first drain electrode D1 to the sixth drain electrode D6 are formed to form the first thin film transistor T1 to the sixth thin film transistor T6, and the OLED is formed together with a fifth insulation layer PL and a pixel definition layer PDL.

In an embodiment of the OLED display 1000 the first thin film transistor T1, includes the first gate electrode G1 that is not doped with the impurity. Each of other transistors, including the second thin film transistor T2 through the sixth thin film transistor T6 includes a second gate electrode G2 to a sixth gate electrode G6 that are doped with the impurity. The first insulation layer GI1 and the second insulation layer GI2 are disposed between the first active layer A1 and the first gate electrode G1 of the first thin film transistor T1, and the first insulation layer GI1 is disposed between the active layer and the gate electrode of each of second thin film transistor T2 to the sixth thin film transistor T6, and thus the impurity can be simply doped to the source area and the drain area of each of the first active layer A1 to the sixth active layer A6 of each of each the first thin film transistor T1 to the sixth thin film transistor T6 although a thick insulation layer is disposed between the first gate electrode G1 and the first active layer A1 of the first thin film transistor T1.

In some embodiments of the OLED display 1000 the thickness of the second insulation layer GI2 cannot exceed a predetermined thickness regardless of an impurity doping process so that the entire thickness of the insulation layer formed between the first active layer A1 and the first gate electrode G1 of the first thin film transistor T1 can be increased more than a predetermined thickness regardless of the impurity doping process.

When the entire thickness of the insulation layer formed between the first active layer A1 of the first thin film transistor T1 and the second gate electrode G2 is thicker than that of the insulation layer formed between the active layer and the gate electrode of each of the switching transistors, that is, the second thin film transistor T2 to the sixth thin film transistor T6, a driving range DR of a gate voltage applied to the first gate electrode G1 of the first thin film transistor T1 is increased, and accordingly, light emitted from the organic light emitting diode OLED can be controlled to have sufficient grays by changing the gate voltage applied to the first gate electrode G1 of the first thin film transistor T1.

That is, the grays can be sufficient by increasing the thickness of the insulation layer between the gate electrode and the active layer of the driving thin film transistor more than a predetermined thickness regardless of a doping process with respect to the active layer so that the OLED display 1000 can have high resolution and an improved display quality.

In some embodiments of OLED display 1000, the first insulation layer GI1 is disposed between the second gate electrode G2 to the sixth gate electrode G6 of each of the switching transistors, thin film transistors T2-T6, such that a thin insulation layer is formed between the active layer and the gate electrode of each thin film transistor. Accordingly, charge mobility of each of the switching thin film transistors, is increased reducing the threshold voltage, and thus, each of the second to sixth thin film transistors T2 to T6 can be turned on and turned off at high speed. Accordingly, the current load of OLED display 1000 is minimized, and image quality of an image displayed in the OLED display 1000 is improved.

In some embodiments of the OLED display 1000, the first capacitor electrode CE1 and the third capacitor electrode CE3 are formed in the same layer where the first gate electrode G1 is formed, and the second capacitor electrode CE2 and the fourth capacitor electrode CE4 are formed as additional metal layers so that the first capacitor C1 and the second capacitor C2 can be respectively formed as metal layers. Accordingly, the first capacitor C1 and the second capacitor C2 do not need to include polysilicon, which may have a non-uniform surface roughness which causes undesired capacitance variation due to undesired surface deformation of the electrode does not occur. That is, each of the first capacitor C1 and the second capacitor C2 can store an exact, and accordingly the driving current through the first thin film transistor T1 can be accurately controlled, thereby suppressing deterioration of display quality.

Some embodiments of the OLED display 1000 include the third insulation layer GI3 as an insulation layer, and accordingly capacitance of each of the first capacitor C1 and the second capacitor C2 is improved. Accordingly, the first capacitor C1 and the second capacitor C2 can be respectively reduced in size so that the OLED display 1000 having high resolution can be formed in the same area.

In some embodiments of the OLED display 1000, the first capacitor C1 and the second capacitor C2 are formed as single-layered capacitors. In some embodiments, at least one of the first and second capacitors may be formed as a multi-layered capacitor including an active electrode or an additional electrode.

Figure 9:
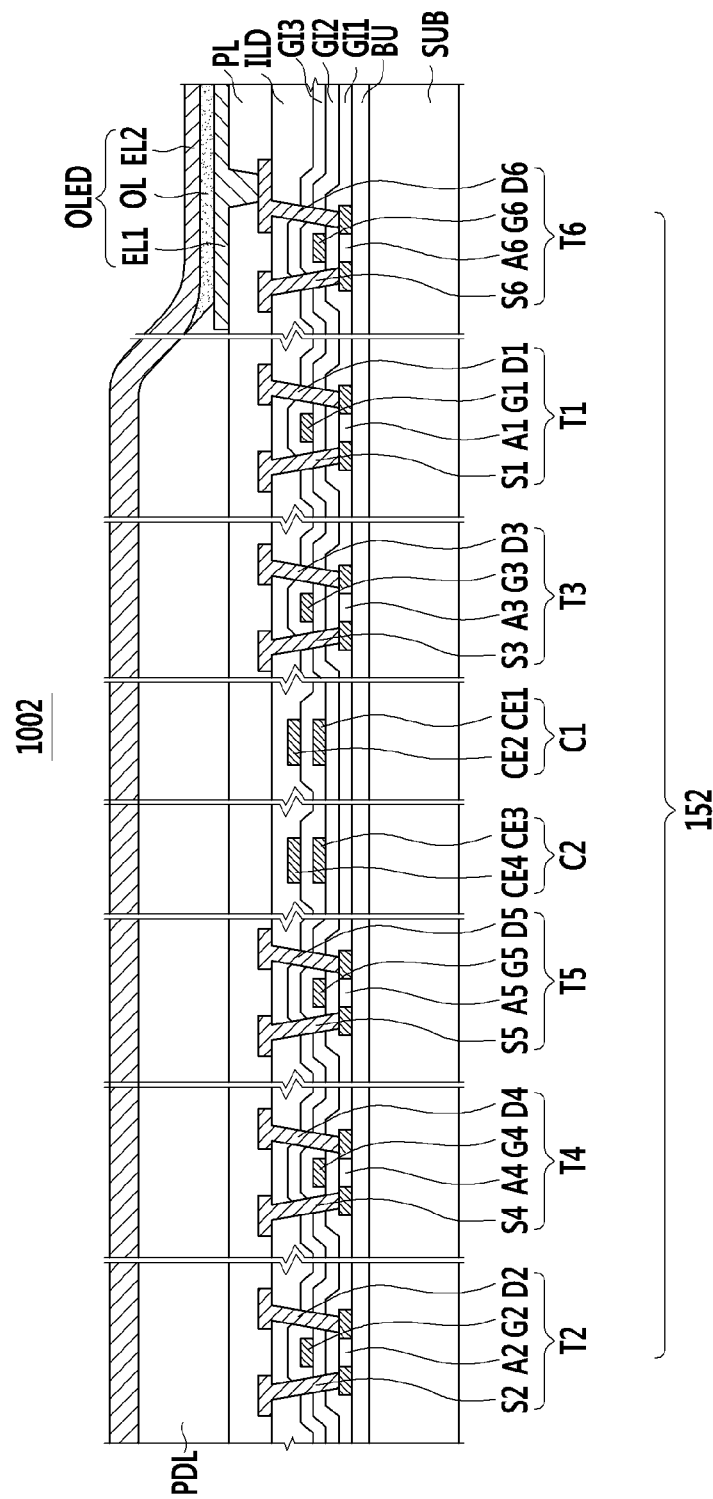
FIG. 9 is a cross-sectional view of a pixel circuit and an organic light emitting element of an OLED display.

Referring to FIG. 9, FIG. 9 depicts a cross-sectional view of an embodiment of a pixel circuit and an organic light emitting diode of an OLED display.

As shown in FIG. 9, a second gate electrode G2 of the second thin film transistor T2 and a third gate electrode G3 of the third thin film transistor T3 are respectively provided on a second active layer A2 and a third active layer A3, interposing a first insulation layer GI1 and a second insulation layer GI2 therebetween. The second gate electrode G2 and the third gate electrode G3 are not doped with an impurity.

As described, in an OLED display 1002 according to the second exemplary embodiment, the second gate electrode G2 of a second thin film transistor T2, which is a switching thin film transistor, and the third gate electrode G3 of the third thin film transistor T3, which is a compensation thin film transistor, are formed in the same layer where the first gate electrode G1 is formed, so that a thick insulation layer is formed. First insulation layer GI1 and second insulation layer GI2 are provided between the second gate electrode G2 and the second active layer A2 and between the third gate electrode G3 and the third active layer A3, and, accordingly, undesirable capacitance does not form in the insulation layers respectively disposed between the second gate electrode G2 and the second active layer A2 and the third gate electrode G3 and the third active layer A3 is decreased. The reduction in undesirable capacitance minimizes the degree of blur occurring in an image displayed by the OLED display. Thus, the OLED display 1002 has high resolution and improved display quality.

In some embodiments of the OLED display 1002, the first to third thin film transistors respectively include the first gate electrodes G1 to the third gate electrodes G3 that are not doped with an impurity. The fourth to sixth thin film transistors T4 to T6 respectively include the fourth gate electrode G4 to the sixth gate electrode G6 that are doped with the impurity. The first insulation layer GI1 and the second insulation layer GI2 are provided between the active layer and the gate electrode of each of the first to third thin film transistors T1 to T3, and the first insulation layer GI1 is provided between the active layer and the gate electrode of each of the fourth to sixth thin film transistors T4 to T6. Accordingly the thickness of the second insulation layer GI2 should not exceed a predetermined thickness regardless of an impurity doping process so that the entire thickness of the insulation layer formed between the first active layer A1 and the first gate electrode G1 of each of the first to third thin film transistors T1 to T3 can be increased more than a predetermined thickness regardless of the impurity doping process.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   gate wires provided on a substrate extending in a first direction;
   data wires provided on the gate wires extending in a second direction that crosses the first direction;
   a pixel circuit including at least a first thin film transistor connected to the gate wires and the data wires, and a second thin film transistor connected to the first thin film transistor; and
   an organic light emitting diode connected to the pixel circuit;
   wherein the first thin film transistor comprises,
      a first active layer provided on a substrate, the first active layer including a channel area, a source area, and a drain area, the source area and the drain area being doped with an impurity, and the first active layer configured to connect the data wires and the organic light emitting diode, and
      a first gate electrode which is not doped with the impurity, and disposed on the first active layer, with sequentially layered first and second insulation layers disposed between the first gate electrode and the first active layer; and
   wherein the second thin film transistor comprises:
      a second active layer provided on the substrate configured to establish a connection between the data wires and the first thin film transistor, the second active layer including a channel area, a source area, and a drain area, wherein the source area and the drain area are doped with the impurity; and
      a second gate electrode provided on the second active layer, and disposed between the second active layer and the first insulation layer, and wherein and the second gate electrode is connected with the gate wires and is doped with the impurity.

2. The OLED display of claim 1, wherein the pixel circuit further comprises a first capacitor connected with the data wires, and wherein
   the first capacitor comprises:
      a first capacitor electrode formed in the same layer where the first gate electrode is formed and electrically connected to the first gate electrode and
      a second capacitor electrode provided on the first capacitor electrode, having a third insulation layer disposed therebetween, wherein the second capacitor electrode is in electrical contact with the data wires.

3. The OLED display of claim 2, wherein the pixel circuit further comprises a second capacitor connected with the gate wires, wherein
   the second capacitor comprising:
      a third capacitor electrode formed in the same layer where the first gate electrode is formed, the third capacitor electrode electrically connected to the first capacitor electrode, and
      a fourth capacitor electrode provided on the third capacitor electrode, having the third insulation layer disposed therebetween, wherein the fourth capacitor electrode is electrically connected with the gate wires.

4. The OLED display of claim 1, wherein the pixel circuit further comprises a second thin film transistor connected to the first thin film transistor, and
   the second thin film transistor comprising:
      a second active layer provided on the substrate configured to establish a connection between the data wires and the first thin film transistor, the second active layer including a channel area, a source area, and a drain area, wherein the source area and the drain area are doped with the impurity; and
      a second gate electrode provided on the second active layer, and disposed on the second active layer having the first insulation layer and the second insulation layer disposed the second gate electrode and the second active layer; and wherein the second gate electrode is not doped with the impurity.

5. An organic light emitting diode (OLED) display comprising:
   gate wires provided on a substrate extending in a first direction;
   data wires provided on the gate wires extending in a second direction that crosses the first direction;
   a pixel circuit comprising:
      a first thin film transistor connected to the gate wires and the data wire, the first thin film transistor comprising:
         a first active layer provided on a substrate, the first active layer including a channel area, a source area, and a drain area, the source area and the drain area being doped with an impurity, and the first active layer configured to connect the data wires and the organic light emitting diode, and
         a first gate electrode which is not doped with the impurity, and disposed on the first active layer, with sequentially layered first and second insulation layers disposed between the first gate electrode and the first active layer;
      a first capacitor connected with the data wires, the first capacitor comprising:
         a first capacitor electrode formed in the same layer where the first gate electrode is formed and electrically connected to the first gate electrode; and
         a second capacitor electrode provided on the first capacitor electrode, having a third insulation layer disposed therebetween, wherein the second capacitor electrode is in electrical contact with the data wires; and
      a second capacitor, connected with the gate wires, comprising:
         a third capacitor electrode formed in the same layer where the first gate electrode is formed, the third capacitor electrode electrically connected to the first capacitor electrode, and
         a fourth capacitor electrode provided on the third capacitor electrode, having the third insulation layer disposed therebetween, wherein the fourth capacitor electrode is electrically connected with the gate wires; and
   an organic light emitting diode connected to the pixel circuit.

* * * * *